(12) United States Patent
Kitagawa et al.

(10) Patent No.: US 7,965,544 B2
(45) Date of Patent: *Jun. 21, 2011

(54) MAGNETIC MEMORY ELEMENT, MAGNETIC MEMORY HAVING SAID MAGNETIC MEMORY ELEMENT, AND METHOD FOR DRIVING MAGNETIC MEMORY

(75) Inventors: Eiji Kitagawa, Sagamihara (JP); Masatoshi Yoshikawa, Yokohama (JP); Tatsuya Kishi, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/844,144

(22) Filed: Jul. 27, 2010

(65) Prior Publication Data
US 2010/0290270 A1 Nov. 18, 2010

Related U.S. Application Data

(63) Continuation of application No. 11/829,408, filed on Jul. 27, 2007, now Pat. No. 7,787,288.

(30) Foreign Application Priority Data

Aug. 21, 2006 (JP) .................................. 2006-224012

(51) Int. Cl.
*G11C 11/00* (2006.01)
(52) U.S. Cl. .......... 365/158; 365/173; 365/172; 365/48; 365/55; 365/74; 365/97; 365/131
(58) Field of Classification Search .................. 365/158, 365/48, 74, 97, 55, 173, 172, 131
See application file for complete search history.

(56) References Cited

U.S. PATENT DOCUMENTS

| 6,256,223 | B1 | 7/2001 | Sun | |
|---|---|---|---|---|
| 2002/0105823 | A1* | 8/2002 | Redon et al. | ..................... 365/97 |
| 2007/0159875 | A1 | 7/2007 | Shimomura et al. | |

FOREIGN PATENT DOCUMENTS

| JP | 2002-261352 | 9/2002 |
|---|---|---|
| JP | 2007-134027 | 5/2007 |
| JP | 2007-310949 | 11/2007 |

* cited by examiner

*Primary Examiner* — Amir Zarabian
*Assistant Examiner* — Fernando N Hidalgo
(74) *Attorney, Agent, or Firm* — Oblon, Spivak, McClelland, Maier & Neustadt, L.L.P.

(57) ABSTRACT

An inadvertent write can be prevented when a read is performed. The duration of the write current pulse for writing information in the magnetic memory layer is longer than the duration of the read current pulse for reading the information from the magnetic memory layer.

3 Claims, 12 Drawing Sheets

MAGNETIC MEMORY ELEMENT, MAGNETIC MEMORY HAVING SAID MAGNETIC MEMORY ELEMENT, AND METHOD FOR DRIVING MAGNETIC MEMORY

CROSS-REFERENCE TO RELATED APPLICATION

This application is a continuation of application Ser. No. 11/829,408, filed Jul. 27, 2007, which is based upon and claims the benefit of priority from prior Japanese Patent Application No. 2006-224012 filed on Aug. 21, 2006 in Japan, the entire contents of which are incorporated herein by reference.

BACKGROUND OF THE INVENTION

1. Field of the Invention

The present invention relates to a magnetic memory element, a magnetic memory including the magnetic memory element, and a method for driving a magnetic memory.

2. Related Art

Magnetic random access memories (MRAMs, hereinafter also referred to simply as magnetic memories) utilizing ferromagnetic materials are expected as nonvolatile memories that has nonvolatility, high-speed operability, large capacities, and low power consumptions. Such a magnetic memory has a structure that includes memory cells each having a "tunneling magneto-resistive effect element (TMR element)" as a magnetic memory element. A TMR element is formed with a sandwich structure film that has one dielectric layer (a tunnel barrier layer) interposed between two ferromagnetic layers. In such a TMR element, a current is applied perpendicularly to the film plane, so as to utilize a tunneling current.

In a conventional MRAM, however, magnetic recording is performed by reversing the magnetization direction of a magnetic layer (the magnetic memory layer) of a magnetic memory element by virtue of a local current magnetic field induced through the line provided above the magnetic memory element. Therefore, the value of the current that can be applied to the line becomes smaller as the device size becomes smaller, and induction of a sufficient current magnetic field becomes difficult. Also, the size of a current magnetic field required for recording information in a magnetic memory element becomes larger, as the device size becomes smaller. Therefore, it is predicted that the principles of a MRAM performing a write utilizing a local current magnetic field induced through a line will reach the limit in the 126 Mbits to 256 Mbits generation.

As a means to perform a write through a magnetization reversal with a lower current, magnetic memories that utilize magnetization reversals by spin injections have been attracting attention (see U.S. Pat. No. 6,256,223, for example). A magnetization reversal by a spin injection is caused by injecting spin-polarized electrons having passing through one of the magnetic layers (the magnetization reference layer) into the other magnetic layer (the magnetic memory layer) in a magnetic memory element, so as to induce a magnetization reversal in the other magnetic layer (the magnetic memory layer). By the method of reversing magnetization by a spin injection, the current required for storing information is determined by the current density of the current flowing in the film thickness direction of the magnetic memory layer. Accordingly, the current required for storing information becomes lower, as the device size becomes smaller.

Furthermore, in a magnetization reversal by a spin injection, the current density required for a magnetization reversal hardly becomes higher, though the device size becomes smaller. Accordingly, writes can be performed with higher efficiency than writes utilizing a current magnetic field.

In a conventional spin-injection MRAM, current paths running in the same direction are used for both write and read. Therefore, spins are injected into the magnetic memory layer of each magnetic memory element during a read operation. The spins injected into the magnetic memory layer impart a torque to the spins in the magnetic memory layer. As a result, the spins in the magnetic memory layer are put in an excited state in terms of energy. Since the spins excited in terms of energy has lower resistance to thermal disturbances, information is inadvertently written in the magnetic memory layer during a read operation, and it is very difficult to maintain the stored information over a long period of time.

To counter this problem, the resistance to thermal disturbances is improved by increasing the memory holding energy of each magnetic memory layer, and an inadvertent write during a read operation is prevented. However, an increase in the memory holding energy of each magnetic memory layer leads to an increase in the write current density, which results in another problem.

It has also been suggested that the ratio of the read current to the write current should be increased. More specifically, the read current is reduced, and the write current is increased, so as to prevent an inadvertent write during a read operation. However, the lower limit of the read current is determined by the sensitivity of the sense amplifier, and the upper limit of the write current is determined by the breakdown voltage of the tunnel barrier layer of each magnetic memory element. Therefore, there is a limit to the increase in the difference between the read current and the write current.

Also, to increase the ratio of the read current to the write current where the lower limit of the read current and the upper limit of the write current are fixed, the variations of the read current value and the write current value are reduced. However, it is very difficult to reduce the variations, since the variations in spin-injection elements become wider as the capacity becomes larger.

SUMMARY OF THE INVENTION

The present invention has been made in view of these circumstances, and an object thereof is to provide a spin-injection magnetic memory element that can prevent an inadvertent write during a read operation, and a magnetic memory that includes the magnetic memory element, and a method for driving a magnetic memory.

According to a first aspect of the present invention, there is provided a method for driving a magnetic memory that includes a memory cell having a magnetic memory element that includes a magnetization reference layer in which a magnetization direction is pinned, a magnetic memory layer in which a magnetization direction is changeable, and a tunnel barrier layer interposed between the magnetization reference layer and the magnetic memory layer, the magnetization direction of the magnetic memory layer being changeable by applying a current pulse and injecting spin-polarized electrons into the magnetic memory layer, the method including: applying a write current pulse for writing information in the magnetic memory layer; and applying a read current pulse for reading the information from the magnetic memory layer, wherein duration of the write current pulse is longer than that of the read current pulse.

According to a second aspect of the present invention, there is provided a magnetic memory including: a memory cell having a magnetic memory element that includes a magnetization reference layer in which a magnetization direction is pinned, a magnetic memory layer in which a magnetization direction is changeable, and a nonmagnetic layer interposed between the magnetization reference layer and the magnetic memory layer, the magnetization direction of the magnetic memory layer being changeable by applying a current pulse to the magnetic memory layer; a read circuit that generates a read current pulse for reading information from the magnetic memory element; a write circuit that generates a write current pulse for writing information in the magnetic memory element, the write current pulse having a longer pulse duration than a pulse duration of the read current pulse; a first line that is connected to one terminal of the magnetic memory element, the write current pulse running through the first line when a write is performed, the read current pulse running through the first line when a read is performed; and a second line that is connected to the other terminal of the magnetic memory element, the write current pulse running through the second line when a write is performed, the read current pulse running through the second line when a read is performed.

According to a third aspect of the present invention, there is provided a magnetic memory element including: a first magnetization reference layer that has a first magnetization direction pinned in one direction; a magnetic memory layer that has a second magnetization direction that runs parallel to the first magnetization direction, the second magnetization direction being changeable by injecting spin-polarized electrons; a nonmagnetic layer that is interposed between the first magnetization reference layer and the magnetic memory layer; a second magnetization reference layer that is provided on the opposite side of the magnetic memory layer from the nonmagnetic layer; and a spin filter layer that is interposed between the second magnetization reference layer and the magnetic memory layer.

According to a fourth aspect of the present invention, there is provided a magnetic memory including: a memory cell that includes the magnetic memory element according to the third aspect; a read circuit that generates a read current pulse for reading information from the magnetic memory element; a write circuit that generates a write current pulse for writing information in the magnetic memory element; a first line that is connected to one terminal of the magnetic memory element, the write current pulse running through the first line when a write is performed, the read current pulse running through the first line when a read is performed; and a second line that is connected to the other terminal of the magnetic memory element, the write current pulse running through the second line when a write is performed, the read current pulse running through the second line when a read is performed.

DETAILED DESCRIPTION OF THE INVENTION

The following is a description of embodiments of the present invention, with reference to the accompanying drawings.

First Embodiment

Figure 1:
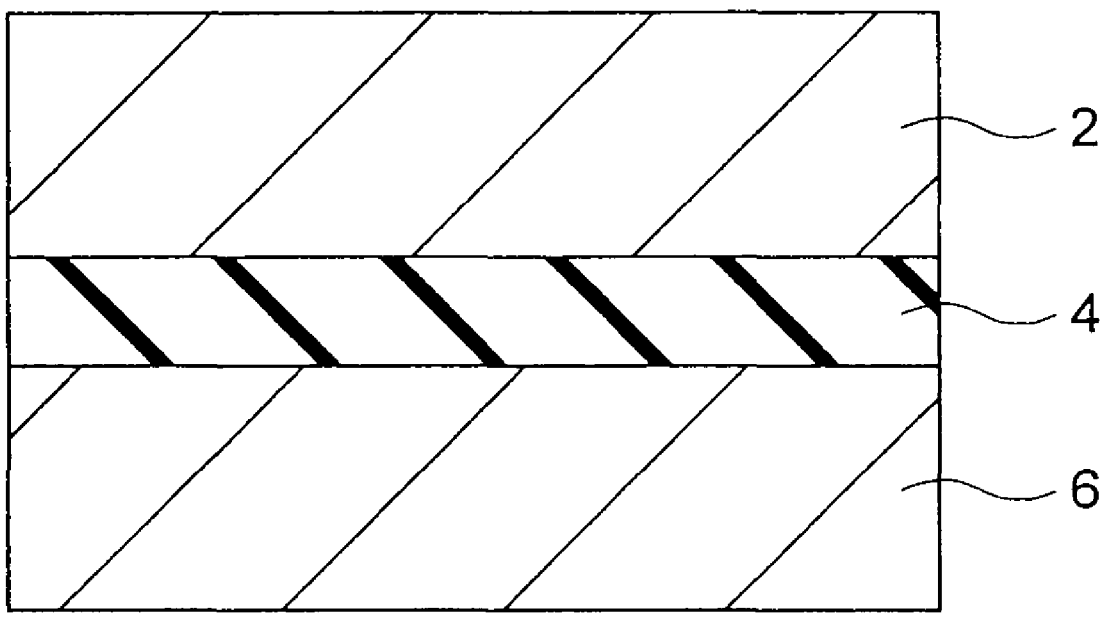
FIG. 1 is a schematic cross-sectional view of the TMR element of a memory of a MRAM.
Figure 2A:
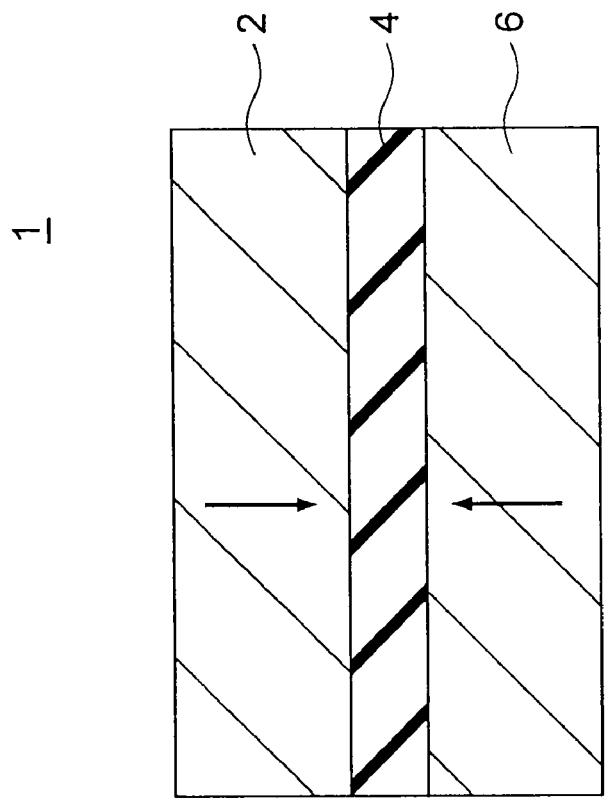
FIGS. 2A and 2B show magnetization directions in the TMR element.
Figure 2B:
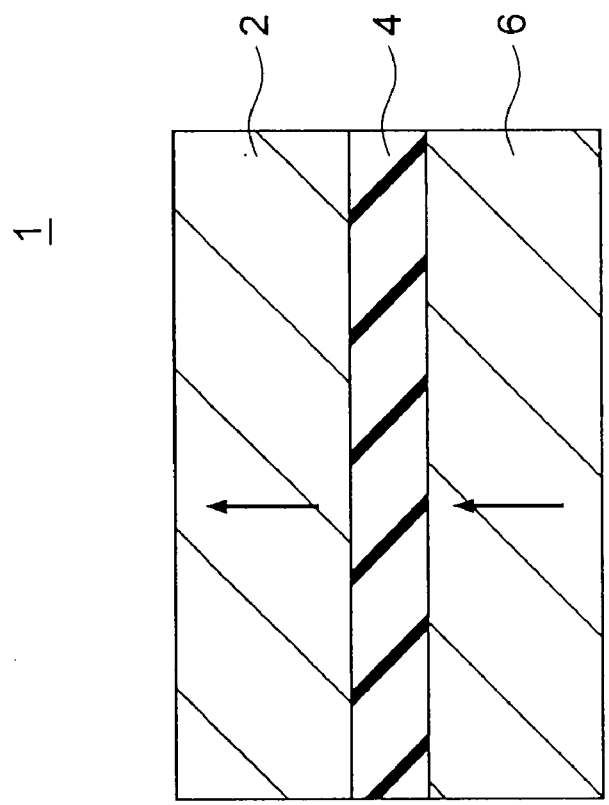

A method for driving a magnetic memory in accordance with a first embodiment of the present invention is described. The driving method of this embodiment is utilized in spin-injection MRAMs (Magnetic Random Access Memories). A MRAM includes memory cells, each of the memory cells having a TMR element as a magnetic memory element. FIG. 1 shows a general structure of a TMR element. This TMR element 1 includes a magnetic layer (a magnetization free layer (a magnetic memory layer)) 2 in which a magnetization direction is changeable, a magnetic layer (a magnetization reference layer) 6 in which a magnetization direction is pinned, and a tunnel barrier layer 4 that is interposed between those magnetic layers. Depending on whether the magnetization directions of the two magnetic layers 2 and 6 are parallel or antiparallel, information "1" or information "0" is provided. FIGS. 2A and 2B show the two patterns of the magnetization directions of the two magnetic layers 2 and 6 of the TMR element 1. As shown in FIG. 2A, when the magnetization directions (indicated by arrows in the drawing) of the two magnetic layers 2 and 6 run parallel to each other (in the same direction), the tunnel resistance of the tunnel barrier layer 4 interposed between the two magnetic layers 2 and 6 becomes lowest (or the tunneling current becomes highest). As shown in FIG. 2, when the magnetization directions of the two magnetic layers 2 and 6 run antiparallel to each other (opposite to each other), the tunnel resistance of the tunnel barrier layer 4 interposed between the two magnetic layers 2 and 6 becomes highest (or the tunneling current becomes lowest). Although, the magnetization directions run perpendicular to the plane of the films in FIGS. 2A and 2B, the magnetization directions may run parallel to the film plane.

In the above MRAM, the two different situations in which the resistance values vary are a "1" memory state ("1" state) and a "0" memory state ("0" state), respectively.

Figure 3:
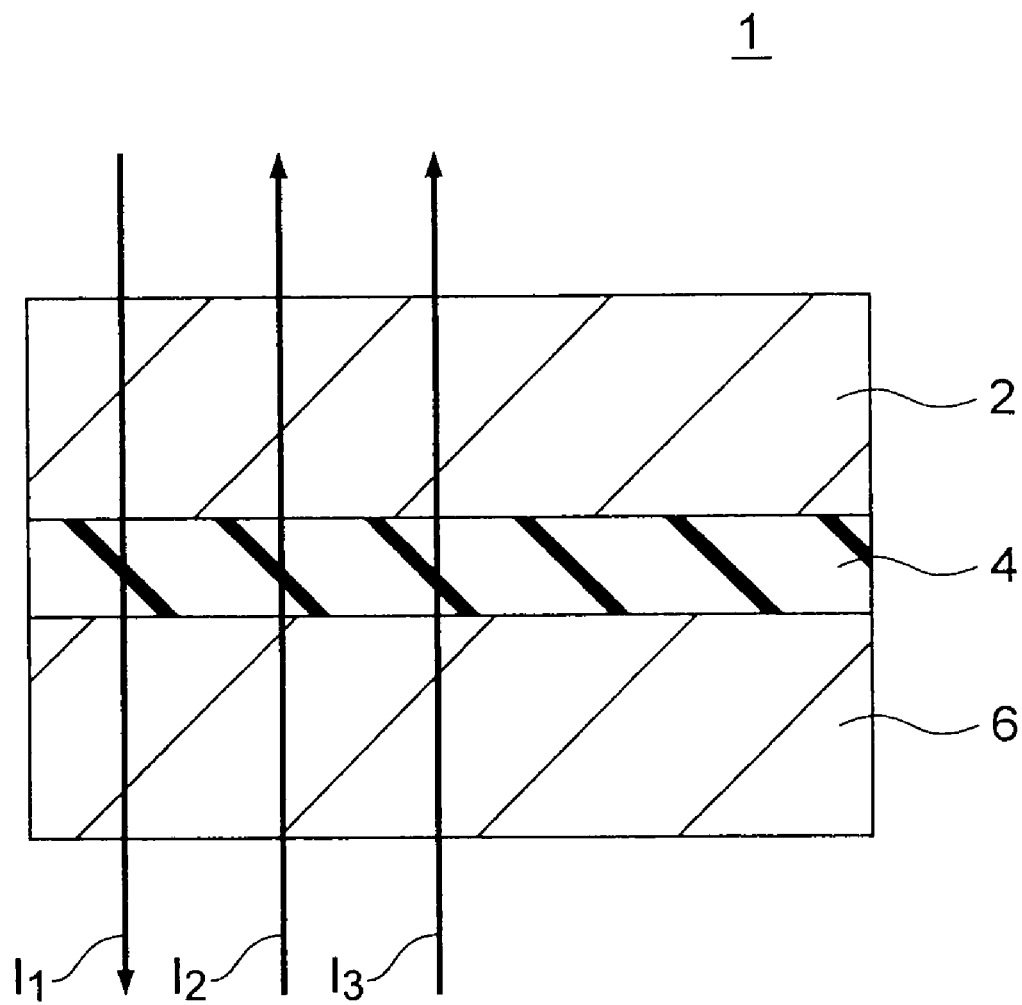
FIG. 3 shows the current directions observed when a write is performed and the current direction observed when a read is performed in a spin-injection TMR element.

FIG. 3 shows the current that flows when a write is performed on the TMR element 1, and the current that flows when a read is performed. Write current $I_1$ is a current that flows when the magnetization directions of the magnetic layers 2 and 6 of the TMR element 1 are changed from an antiparallel state to a parallel state. Write current $I_2$ is a current that flows when the magnetization directions of the magnetic layers 2 and 6 of the TMR element 1 are changed from a parallel state to an antiparallel state. The write current $I_1$ flows from the magnetic layer (the magnetic memory layer) 2 to the magnetic layer (the magnetization reference layer) 6 via the tunnel barrier layer 4. The write current $I_2$ flows from the magnetic layer (the magnetization reference layer) 6 to the magnetic layer (the magnetic memory layer) 2 via the tunnel barrier layer 4. Further, read current $I_3$ is a current that flows when information is read from the TMR element 1. The read current $I_3$ flows from the magnetic layer (the magnetization reference layer) 6 to the magnetic layer (the magnetic memory layer) 2 via the tunnel barrier layer 4. In a MRAM, the write current $I_2$ and the read current $I_3$ flow in the same direction with respect to the TMR element 1. As the read current $I_3$ imparts a spin torque to the magnetic memory layer 2, the magnetic memory layer 2 is disturbed by the read current $I_3$.

Figure 4:
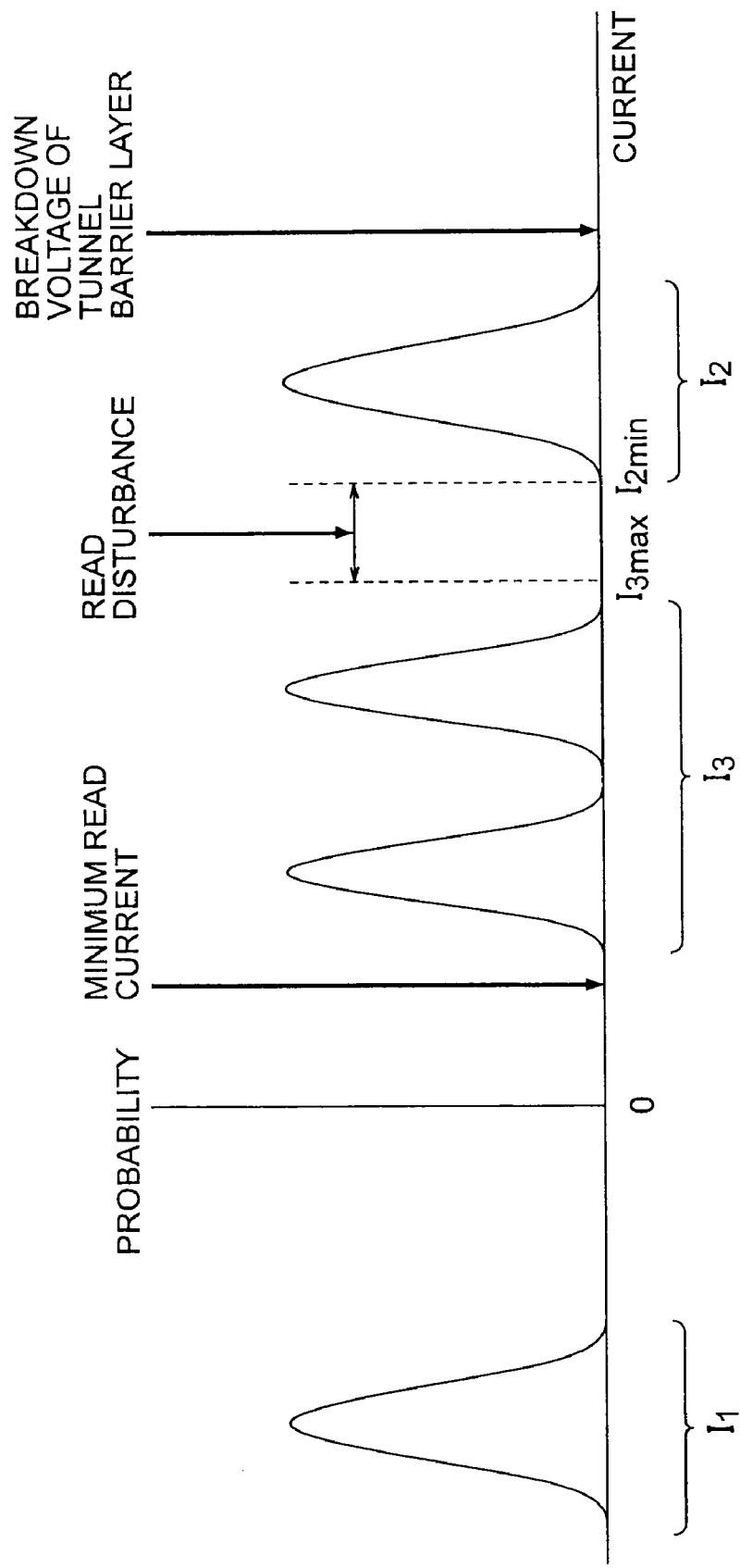
FIG. 4 illustrates disturbances during a read operation.

FIG. 4 shows the distribution of the read current $I_3$ and the write currents $I_1$ and $I_2$ in a 1-Gbits MRAM. In FIG. 4, the abscissa axis indicates the current, and the ordinate axis indicates the probability of read bits with the current and the probability of written bits with the current. The left half of the graph showing the distribution of the read current $I_3$ in FIG. 4 represents a case where the magnetization directions of the magnetic memory layer and the magnetization reference layer of the TMR element run antiparallel to each other (the case of high resistance), and the right half of the graph showing the distribution of the read current $I_3$ represents a case where the magnetization directions of the magnetic memory layer and the magnetization reference layer of the TMR element run parallel to each other (the case of low resistance). In FIG. 4, the direction in which the currents $I_2$ and $I_3$ flow is the positive direction, and the direction in which the current $I_1$ flows is the negative direction.

As shown in FIG. 4, the write current $I_2$ and the read current $I_3$ appear in an intermittent fashion. Where the ratio $I_{3max}/I_{2min}$ of the maximum value $I_{3max}$ of the read current $I_3$ to the minimum value $I_{2min}$ of the write current $I_2$ is close to 1, an inadvertent write is caused in the magnetic memory layer 2 when a read is performed. The ratio $I_{3max}/I_{2min}$ of the read current to the write current that causes an inadvertent write can be determined by the following conditions. In the following description, the maximum current value $I_{3max}$ is referred to as $I_{read1}$, and the minimum current value $I_{2min}$ is referred to as $I_{write1}$, though those are synonymous.

The number of bits of memory information that is lost due to heat fluctuations caused after a 1-Gbits MRAM is driven at 1 GHz for ten years is expressed by the following equation (1):

$$n = N \cdot f \cdot \tau \cdot e^{-\beta} \qquad (1)$$

When n becomes 1 or smaller by the above equation, the number of bits of information that is lost after a 10-year operation is 1 bits or less. In the equation (1), N represents the size (bits) of the MRAM, f represents the operating frequency (Hz), τ represents the relaxation time (sec), and β can be determined by applying the following conditions to the respective values. For example, where N is a Gbits, f is 1 GHz, and is 10 years (3.15×10⁸ sec), β is determined as the value that satisfies the condition that n should be 1 or smaller.

Meanwhile, with the relationship with the thermal disturbance being taken into consideration, the value of β is expressed as:

$$\beta = \Delta E/K_B T = \alpha_{therm}(1 - I_{read1}/I_{write1}) \qquad (2)$$

where T represents the operating temperature (K), $K_B$ represents the Boltzmann constant (1.38×10²² erg/K), and ΔE represents the size of the energy barrier. When an energy equal to or larger than ΔE is applied from the outside, the spin cannot maintain the magnetization information. Further, $I_{read1}$ represents the current value observed when a read is performed, and $I_{write1}$ represents the write current value. Since the value of β is determined so as to satisfy the condition that "the rate of memory information loss due to heat fluctuations after a 1-Gbits MRAM is driven at 1 GHz for ten years is 1 bit or less", the value of $\alpha_{therm}$ can be determined if the values of $I_{read1}$ and $I_{write1}$ are determined.

Also, $\alpha_{therm}$ can be expressed by the following equation:

$$\alpha_{therm} = K_u V/K_B T \qquad (3)$$

where $K_u$ represents the magnetic anisotropic constant (erg/cm³), and V represents the volume (cm³) of the magnetic memory layer. Accordingly, $\alpha_{therm}$ represents the ratio of the magnetic energy $K_u V$ of the magnetic memory layer to the thermal energy $K_B T$.

Meanwhile, the area A (cm²) of the magnetic memory layer is uniquely determined by the size and integration degree of the MRAM. Therefore, where the film thickness of the magnetic memory layer is represented by t (cm), the volume of the magnetic memory layer is determined by the product A×t of the area A of the magnetic memory layer and the film thickness t of the magnetic memory layer. For example, where the temperature at which an operation is guaranteed is 85° C., the following expression (4) is established by the equation (2) and the equation (3):

$$K_u A t(1 - I_{read1}/I_{write1})/(K_B \times 358) = 61 \qquad (4)$$

Since the value of A is uniquely determined by the design environment, the values that satisfies the condition that "the rate of memory information loss due to heat fluctuations after a 1-Gbits MRAM is driven at 1 GHz for ten years is 1 bit or less" are determined by t, $K_u$, and $I_{read1}/I_{write1}$.

Increases in t and $K_u$ lead to an increase in write current. Therefore, $(1-I_{read1}/I_{write1})$ needs to be as large as possible. In other words, $I_{read1}$ needs to be as small as possible with respect to $I_{write}$. However, as described above, the lower limit of the read current and the upper limit of the write current are determined by the sensitivity of the sense amplifier and the size of the breakdown voltage of the tunnel barrier layer of the TMR element, and there is a limit to the increase of the difference between $I_{read1}$ and $I_{write1}$.

Alternatively, so as to increase the ratio of $I_{read1}$ to $I_{write1}$ where the lower limit of the read current and the upper limit of the write current are fixed, the variations in the read current value and the write current value are reduced. However, the variations in a spin-injection element increase, as the capacity increases. Therefore, it is very difficult to reduce those variations.

Figure 5:
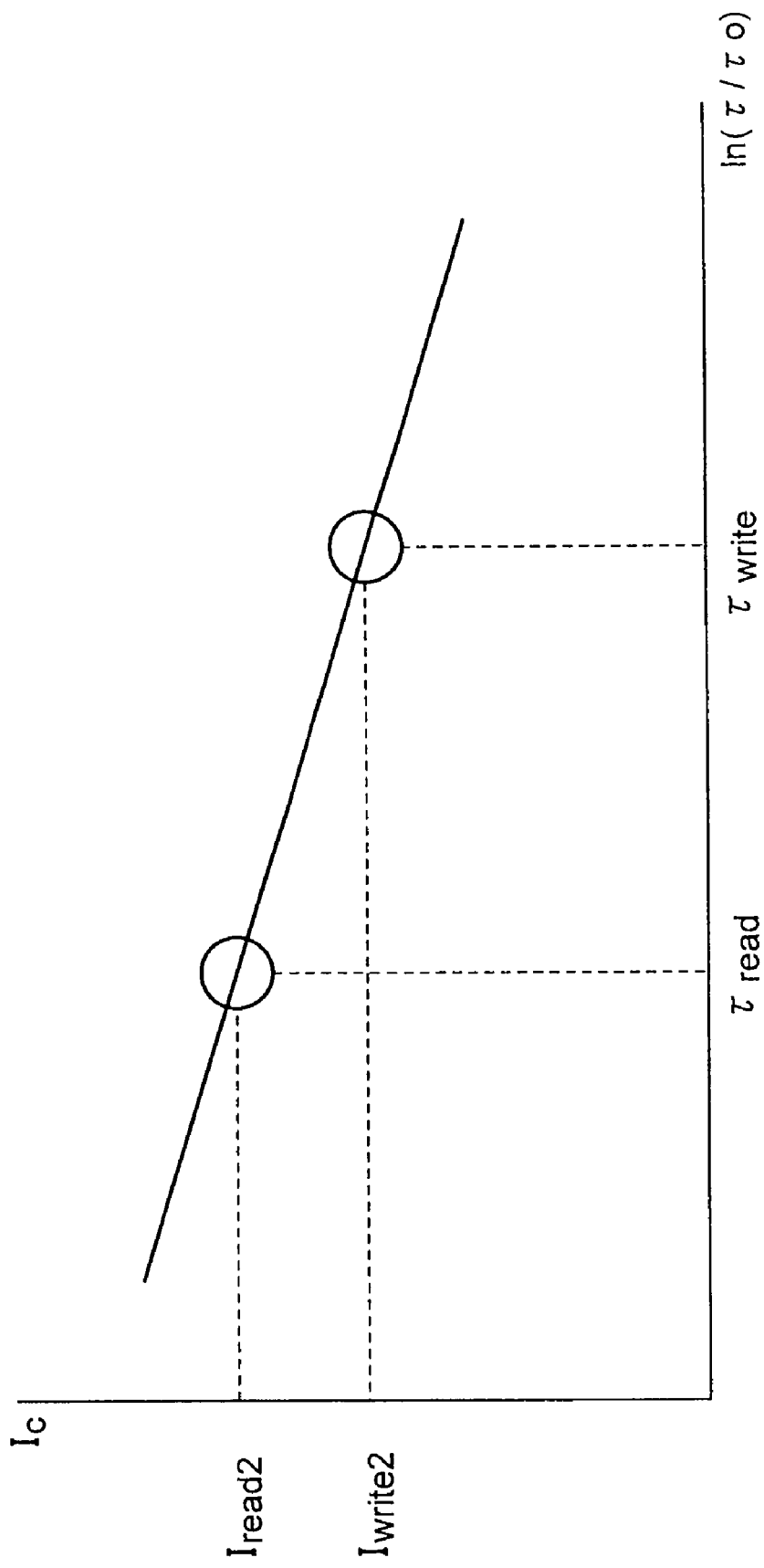
FIG. 5 shows a variation of a reverse current Ic disturbed depending on the pulse duration (application time)

Meanwhile, the relationship between the application time (τ) of the write or read current and the current value $I_C$ with which a magnetization reversal is caused due to a spin injection can be classified into two patterns on the basis of different magnetization reversal origins. The first origin is observed where τ is larger than $\tau_0$, and the spin is reversed due to a thermal disturbance. Here, $\tau_0$ (referred to as the initial reversal-related switching time in the present invention) represents the time required where the spins onto which spin-injection torque is imparted by the write or read current is reversed while in procession movement (as disclosed by K. Yagami, A. A. Tulapurkar, A. Fukushima, and Y. Suzuki in IEEE TRANSACTIONS ON MAGNETICS, VOL. 41, No. 10, 2615 (2005)). FIG. 5 shows the relationship between the application time of the write or read current and the current value $I_C$ with which the magnetization is reversed by a spin injection, where $\tau$ is larger than $\tau_0$. In FIG. 5, the abscissa axis indicates the current application time $\tau$, and the ordinate axis indicates the current value $I_C$ with which the magnetization is reversed by a spin injection. Where $\tau$ is larger than $\tau_0$, a spin-injection magnetization reversal is expressed by the following expression, due to the influence of a thermal disturbance.

$$I_C = I_{C0}\{1-(K_B T/\Delta E) ln(\tau/\tau_0)\} \quad (5)$$

where $I_{C0}$ represents the current value with which a spin-injection magnetization reversal is caused in the time $\tau_0$. As can be seen from the equation (5) and FIG. 5, the current value $I_C$ with which a magnetization reversal is caused due to a spin injection decreases in proportion to the logarithm of the time $\tau$ during which a current is applied. Accordingly, the read current application time $\tau_{read}$ is made shorter than the write current application time $\tau_{write}$, so that the current value $I_{read2}$ with which an inadvertent write is caused due to a spin-injection magnetization reversal at the time of a read becomes larger than the current value $I_{write2}$ necessary to perform a write (see FIG. 5). So as to make $I_{read1}/I_{write1}$ smaller than 1, which is the condition for preventing an inadvertent write during a read operation, it is necessary to set $I_{write1}$ at a larger value than the value of $I_{read1}$. This is because an energy equivalent to $I_{write1}$ is generated due to the addition of the thermal disturbance energy to $I_{read1}$ during a read operation, and an inadvertent write is caused during the read operation, unless the difference between $I_{write1}$ and $I_{read1}$ is sufficiently large. If the current value with which an inadvertent write is caused during a read operation can be set as $I_{read2}$ by performing a read before a write, the current necessary for a spin-injection magnetization reversal is equal to or higher than $I_{read2}$, even when the thermal disturbance is added to the read current and an energy equivalent to $I_{write1}$ is added at the time of a read. Thus, an inadvertent write is not caused.

In other words, as the application time of the read current for performing a read is made shorter than the application time of the write current for performing a write on the magnetic memory layer, the apparent value of $I_{read1}/I_{write1}$ becomes smaller, and an inadvertent write during a read operation can be prevented. This is a fact discovered by the inventors of the present invention.

Also, as the value of the ratio $I_{read1}/I_{write1}$ becomes smaller, the value of $(1-I_{read1}/I_{write1})$ becomes larger. Accordingly, the values of t and $K_u$ can be made smaller. Thus, the power consumption can also be reduced.

Meanwhile, where the application time ($\tau$) of the write current or the read current is shorter than $\tau_0$, the current value necessary for a magnetization reversal due to a spin injection dramatically increases due to a gyromagnetic effect. Where $\tau$ is equal to $\tau_0$, the write or read current imparts a torque to spins, and the spins move in a certain orbit, and are reversed while in procession movement. The precession orbit is determined by the damping constant $\alpha_{damp}$, the gyromagnetic factor $\gamma$, and the value of the effective magnetic field $H_{eff}$, which are material parameters.

To make $\tau$ smaller than $\tau_0$, the precession orbit needs to be changed, and the spin damping needs to be made larger.

Figure 6:
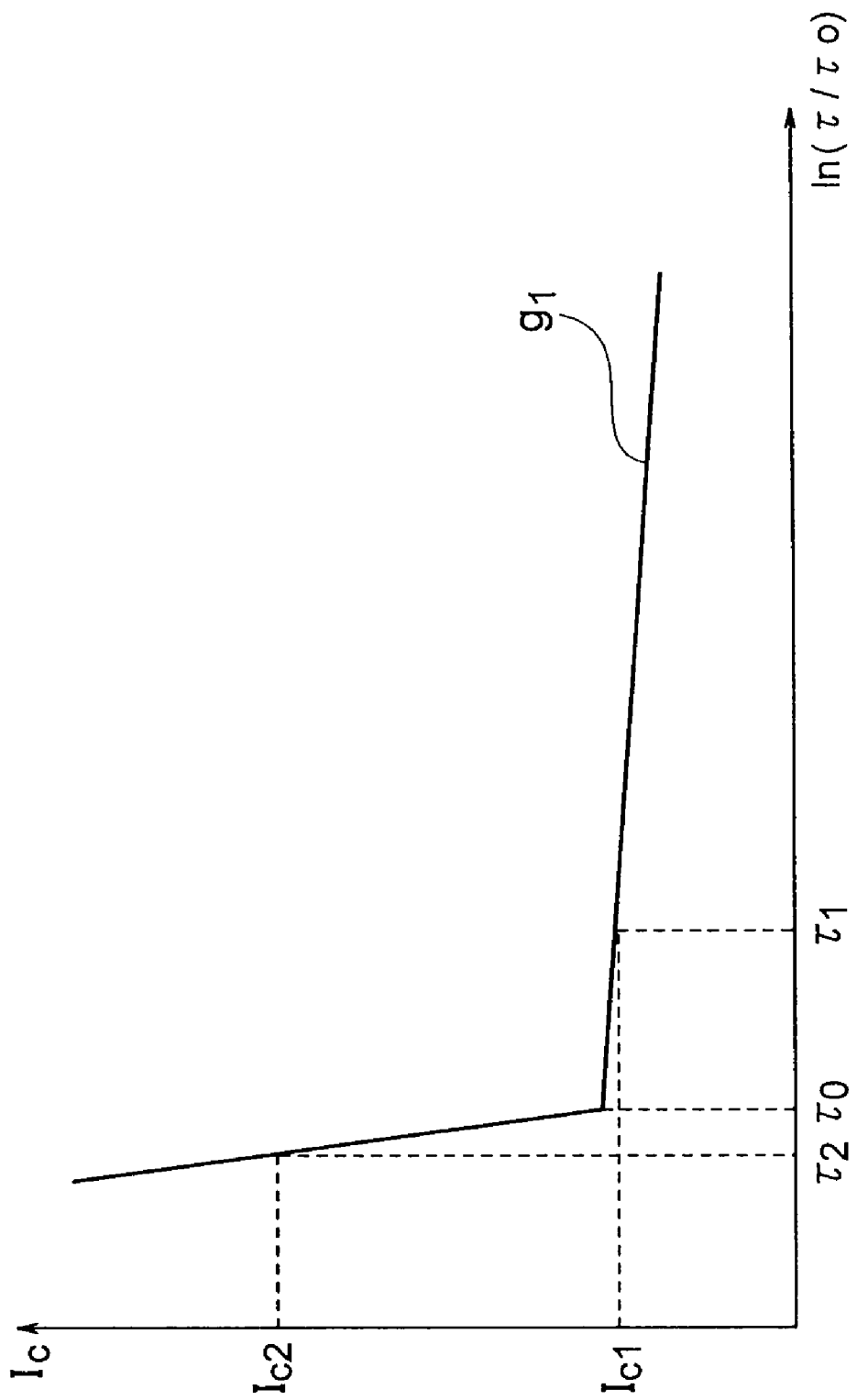
FIG. 6 shows a variation of a reverse current Ic disturbed depending on the pulse duration.

Therefore, a higher spin-injection magnetization reversal current is required. This phenomenon is referred to as the gyromagnetic effect in this specification. FIG. 6 illustrates this phenomenon. Graph $g_1$ in FIG. 6 shows the relationship between the current application time $\tau$ in the neighborhood of the pulse duration $\tau_0$ and the current value $I_C$ required for a magnetization reversal by a spin injection. When the application time $\tau$ becomes shorter than the initial reversal-related switching time $\tau_0$, the current value $I_C$ required for a magnetization reversal drastically increases due to the gyromagnetic effect. If a write is performed with the pulse duration at the application time $\tau_1$ ($>\tau_0$) and a read is performed at the application time $\tau_2$ ($<\tau_0$), the write current value becomes $I_{C1}$, and the current value that causes an inadvertent write during read operation becomes $I_{C2}$. In the case shown in FIG. 6, $(1-I_{read1}/I_{write1})$ should be $(1-I_{C1}/I_{C2})$, because the current value $I_{write1}$ that causes an inadvertent write during a read operation is substituted by $I_{C2}$, with $I_{read1}$ being a smaller current value than the write current value or being $I_{C1}$, which is equal to the write current value. Accordingly, $I_{read1}/I_{write1}$ becomes dramatically smaller, and $(1-I_{read1}/I_{write1})$ becomes closer to 1, which is the ideal value. As a result, while an inadvertent write in a read operation is prevented, t and $K_u$ can be reduced, and $\alpha_{therm}$ can also be reduced, where the condition that "the rate of memory information loss due to heat fluctuations after a 1-Gbits MRAM is driven at 1 GHz for ten years is 1 bit or less" is satisfied. This fact was also found by the inventors.

Incidentally, as the application time of the read current for performing a read is made shorter than the application time of the write current for performing a write on the magnetic memory layer, it is expected to generate heat by applying current. Therefore, the apparent value of $I_{read1}/I_{write1}$ becomes smaller, and an inadvertent write during a read operation can be prevented.

Figure 7:
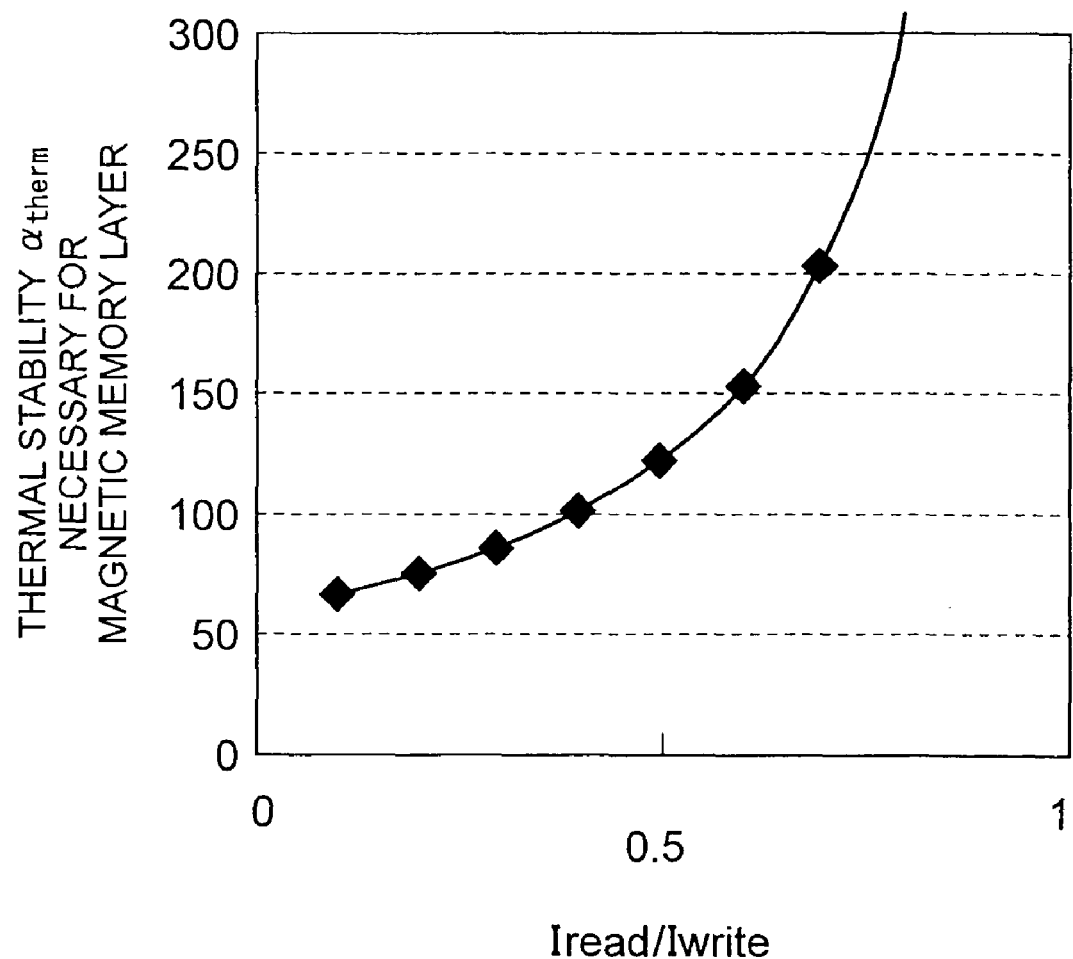
FIG. 7 shows the value $\alpha_{therm}$ required in the magnetic memory layer with respect to the ratio of the read current to the write current.

FIG. 7 shows the relationship between $I_{read1}/I_{write1}$ and $\alpha_{therm}$. Since the write current $I_{write}$ required for a magnetization reversal through a spin injection increases in proportion to $\alpha_{therm}$, a reduction in $\alpha_{therm}$ is necessary for a reduction in the current for a magnetic reversal through a spin injection. When $I_{read}/I_{write}$ is 0.8 $\alpha_{therm}$ needs to be 305. However, when a read operation utilizing the gyromagnetic effect is performed, $I_{read}/I_{write}$ dramatically decreases, and can be as small as 0.4 or less. When $I_{read}/I_{write}$ is 0.4, $\alpha_{therm}$ needs to be 102. Accordingly, the current value required for a spin-injection magnetization reversal can be reduced to a third of the original value.

Where $\tau_0$ is 1 nsec or less, the value of the magnetic anisotropy field needs to be 50 Oe or larger in real design, because $\tau_0$ is determined by the magnetic anisotropy field and the spin direction of the magnetic memory layer. If the anisotropy field becomes too large, on the other hand, $\tau_0$ becomes extremely small, and accordingly, the read time becomes extremely short so that the read time is made equal to or shorter than $\tau_0$, as the gyromagnetic effect is utilized in a read operation. As a result, it becomes difficult to maintain a sufficient read current value. Therefore, the optimum size of the anisotropy field is 50 Oe to 5000 Oe.

Figure 8:
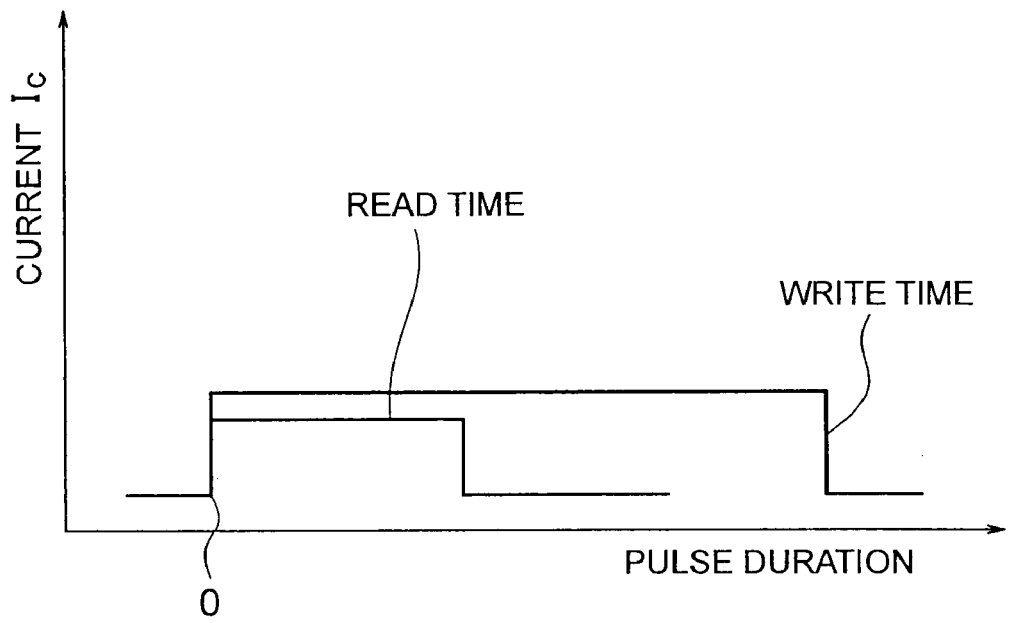
FIG. 8 illustrates a method for driving a MRAM in accordance with a first embodiment of the present invention.

As described above, in accordance with this embodiment, the duration (application time) of the read pulse for reading information (data) from the magnetic memory layer is made shorter than the duration of the write pulse for writing information, as shown in FIG. 8. In this manner, an inadvertent write during a read operation can be prevented. In FIG. 8, the leading edges of the reading pulse and the writing pulse are shown at the same point, to facilitate the comparison between the two pulse durations. Here, the read pulse duration is the duration of the read time generated by a pulse, and the write pulse duration is the duration of the write time generated by a pulse.

Figure 9:
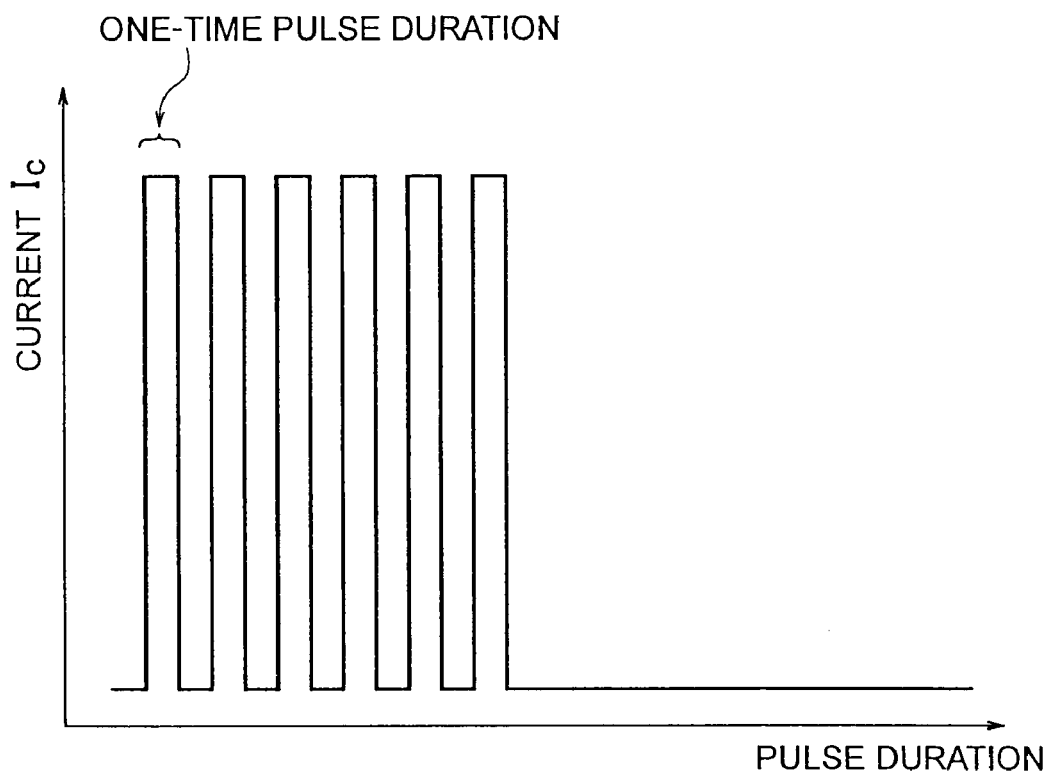
FIG. 9 illustrates a first modification of the driving method of the first embodiment.

When the read pulse duration becomes shorter, the read current value becomes smaller. As a result, the necessary output for obtaining the information "1" and "0" cannot be achieved. Therefore, as shown in FIG. 9, the read current is divided into pulses with a small duration, and information should be obtained through an integrated read current value. In this manner, a sufficient output can be achieved.

Figure 10:
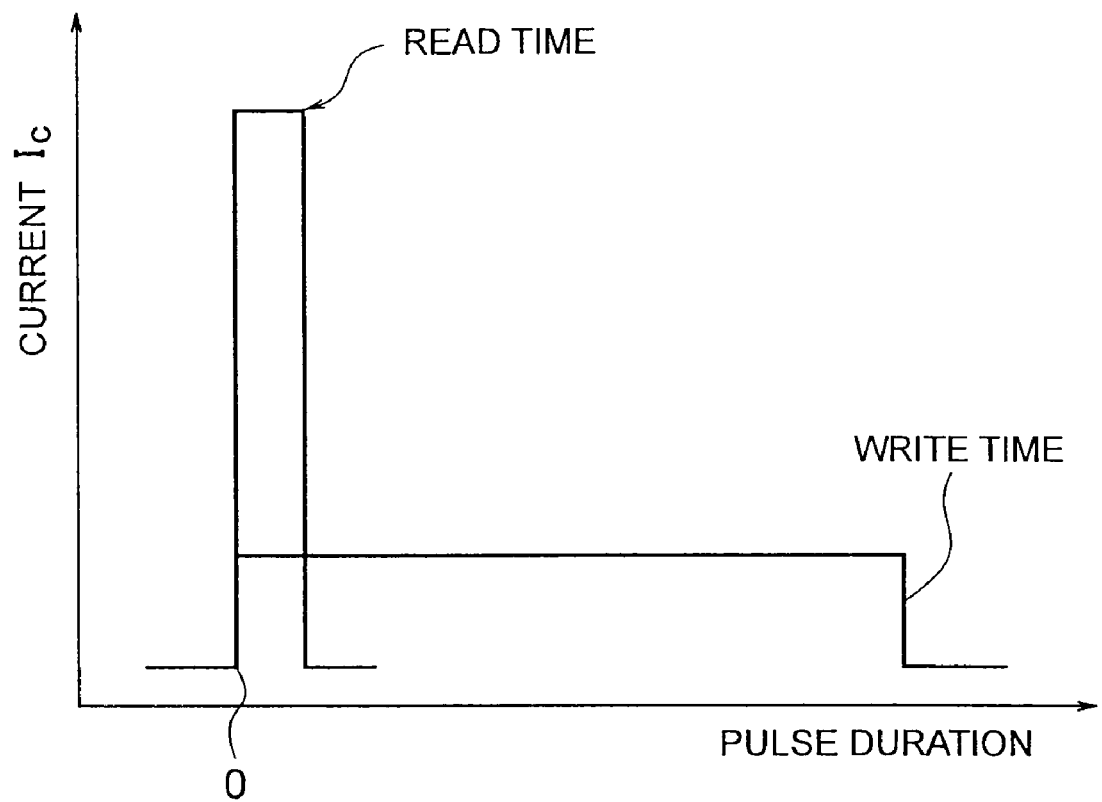
FIG. 10 illustrates a second modification of the driving method of the first embodiment.

Alternatively, as shown in FIG. 10, the read current with a shorter pulse duration can be made larger than the read current, so as to achieve a sufficient output. In such a case, the read current needs to be made smaller than the current value $I_{read2}$ shown in FIG. 5, which is determined by the pulse duration $\tau_{read}$ of the read current, or smaller than the current value $I_{C2}$ shown in FIG. 6. Otherwise, an inadvertent write is caused during a read operation.

Second Embodiment

Figure 11:
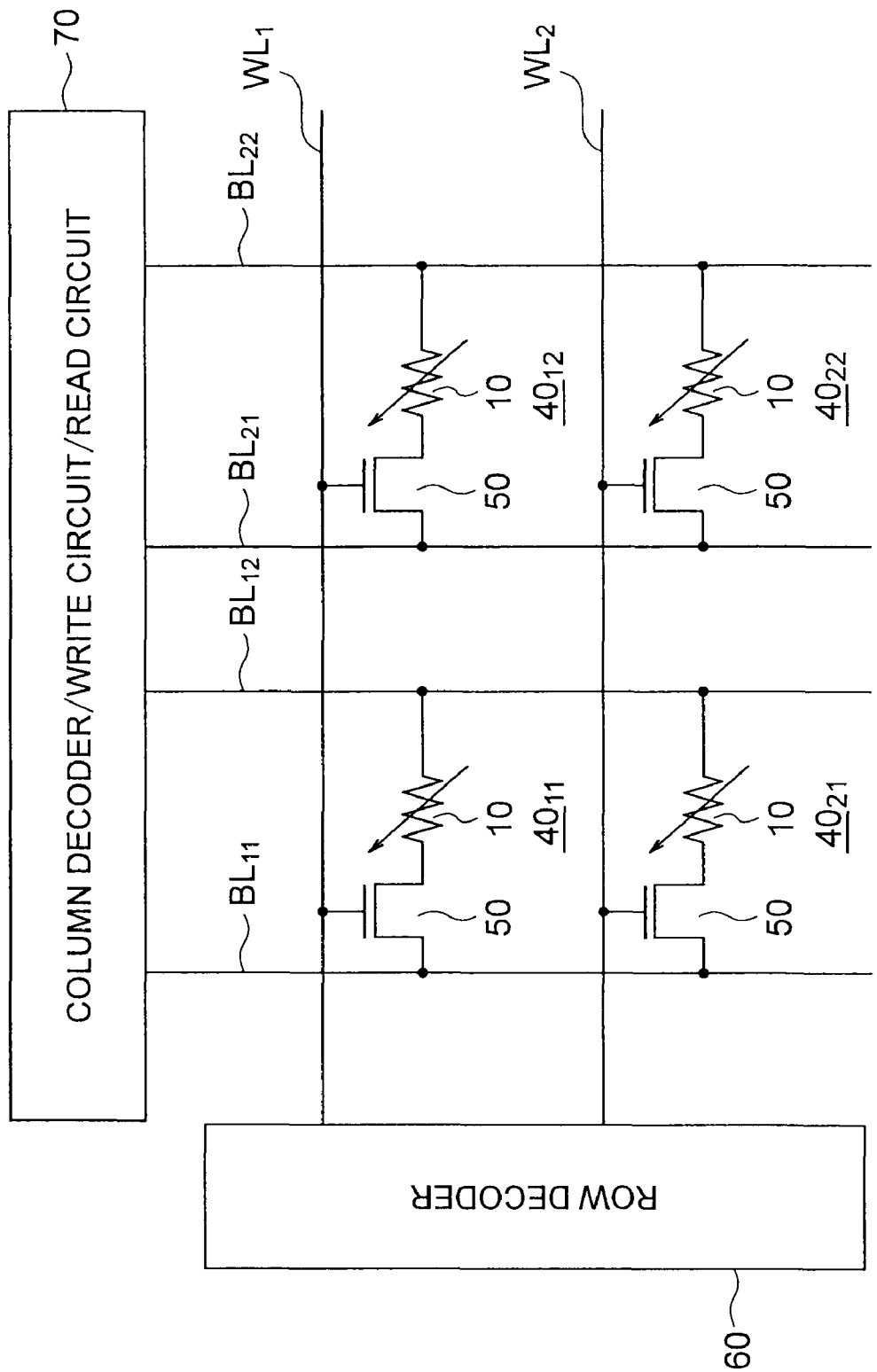
FIG. 11 is a circuit diagram showing a magnetic memory in accordance with a second embodiment of the present invention.

Referring now to FIGS. 11 to 14, a magnetic memory in accordance with a second embodiment of the present invention is described. The magnetic memory of this embodiment is a spin-injection MRAM. As shown in FIG. 11, the magnetic memory of this embodiment includes memory cells $40_{ij}$ (i, j=1, 2), word lines $WL_i$ connected to the respective memory cells $40_{ij}$, two bit lines $BL_{j1}$ and $BL_{j2}$ connected to the respective memory cells $40_{ij}$, a row decoder 60 that selects the word lines $WL_i$, and a column decoder/write circuit/read circuit 70 that selects the two bit lines $BL_{j1}$ and $BL_{j2}$.

Each of the memory cells $40_{ij}$ (i, j=1, 2) includes a magnetic memory element 10 and a selective transistor 50. One end of the magnetic memory element 10 of each memory cell $40_{ij}$ is connected to the bit line $BL_{j2}$, and the other end is connected to one end (either the source or the drain) of the selective transistor 50. The other end of the selective transistor 50 of each memory cell $40_{ij}$ is connected to the bit line $BL_{j1}$, and the gate is connected to the word lines $WL_i$.

Figure 12:
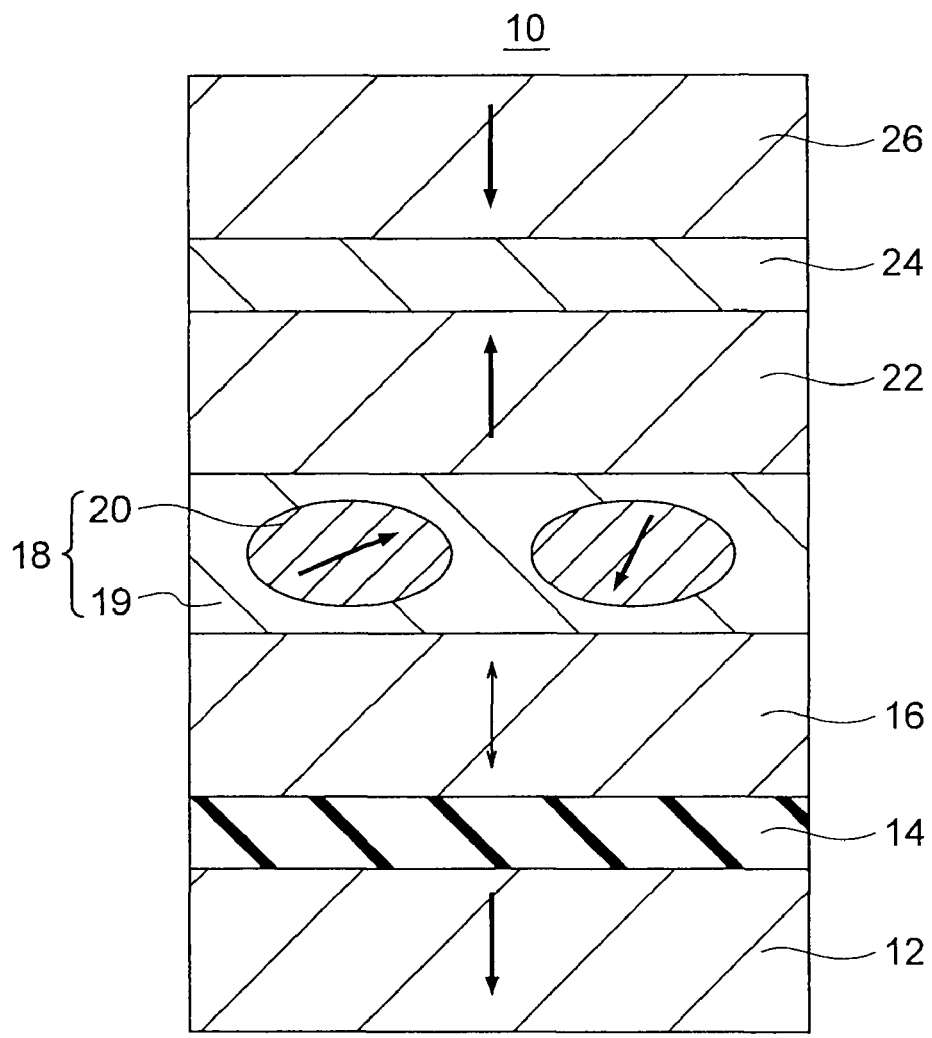
FIG. 12 is a cross-sectional view of a magnetic memory element of the magnetic memory in accordance with the second embodiment.

As shown in FIG. 12, the magnetic memory element 10 employed in the magnetic memory of this embodiment includes a magnetization reference layer 12, a tunnel barrier layer 14 formed on this magnetization reference layer 12, a magnetic memory layer 16 provided on the tunnel barrier layer 14, a spin filter layer 18 provided on the magnetic memory layer 16, a magnetization reference layer 22 provided on the spin filter layer 18, a nonmagnetic layer 24 provided on the magnetization reference layer 22, and a magnetization reference layer 26 provided on the nonmagnetic layer 24. The magnetic memory layer 16 and the magnetization reference layers 12, 22, and 26 should preferably be made of a material with a high crystal magnetic anisotropy energy density.

The magnetic memory element 10 of this embodiment has spin (magnetization) directions perpendicular to the film plane, and those spin directions are indicated by the arrows in the drawing. The spin directions in the magnetization reference layers 12 and 26 are downward directions, and the spin direction in the magnetization reference layer 22 is an upward direction. However, the spin directions in the magnetization reference layers 12, 26, and 22 may be 180° reversed.

The magnetic memory element 10 of this embodiment may have spin (magnetization) directions parallel to the film plane. In the case of the parallel state, the magnetization reference layers 12 and 26 have the same spin directions, but the magnetization reference layer 22 has a spin direction opposite to the spin directions in the magnetization reference layers 12 and 26.

The spin filter layer 18 has a so-called granular structure in which nano-sized magnetic materials 20 of crystal magnetic anisotropy are scattered in a non-magnetic layer 19. In this case, the direction of the crystal magnetic anisotropy of the magnetic materials 20 varies among particles, and the magnetization of the magnetic materials 20 in the spin filter layer 18 is almost zero at an operation temperature of a magnetic memory element (−20° C. to 80° C.) and in a magnetic-field nonexistence state (where an external magnetic field does not exist). In other words, the magnetic materials 20 are superparamagnetic. Also, the magnetic materials 20 in the spin filter layer 18 preferably has a lower magnetic anisotropy energy density than the magnetic anisotropy energy density of the magnetic memory layer 16, as will be described later.

Figure 13:
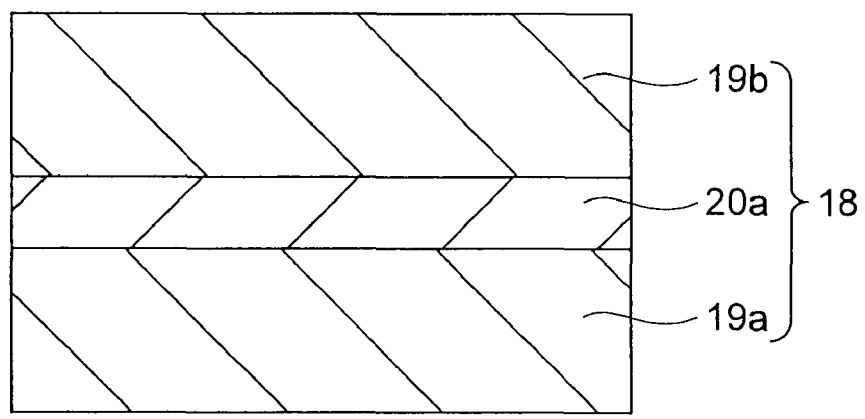
FIG. 13 is a cross-sectional view showing another example of the spin filter layer in accordance with the second embodiment.

As shown in FIG. 13, the spin filter layer 18 may have a structure in which a magnetic layer 20a having magnetic anisotropy is interposed between two nonmagnetic layers 19a and 19b. In this case, the magnetization of the magnetic layer 20a is almost zero at an operation temperature of a magnetic memory element (−20° C. to 80° C.) and a magnetic-field nonexistence state (where an external magnetic field does not exist). In other words, the magnetic layer 20a is superparamagnetic. Also, the magnetic anisotropy energy density of the magnetic layer 20a is preferably lower than the magnetic anisotropy energy density of the magnetic memory layer 16, and the film thickness of the magnetic layer 20a is preferably smaller than the film thickness of the magnetic memory layer 16.

Next, an operation of the magnetic memory of this embodiment is described.

Where information is to be written in a memory cell, a word line connected to the memory cell 40 in which a write is to be performed is selected by the row decoder 60, and the selective transistor 50 of the memory cell 40 is turned on. The two bit lines connected to the memory cell 40 are then selected by the column decoder of the column decoder/write circuit/read circuit 70, and a write current is applied to the magnetic memory element 10 of the memory cell 40 via the selected bit lines by the write circuit of the column decoder/write circuit/read circuit 70. Thus, a write is performed.

Where a read is to be performed, a word line connected to the memory cell 40 in which a read is to be performed is selected by the row decoder 60, and the selective transistor 50 of the memory cell 40 is turned on. The two bit lines connected to the memory cell 40 are then selected by the column decoder of the column decoder/write circuit/read circuit 70, and a read current is applied to the magnetic memory element 10 of the memory cell 40 via the selected bit lines by the read circuit of the column decoder/write circuit/read circuit 70. The potential between the selected bit lines is then detected by the read circuit of the column decoder/write circuit/read circuit 70. Thus, a read is performed.

Next, a method for performing a write in a magnetic memory element 10 of this embodiment is described.

In a case where the magnetization direction of the magnetic memory layer 16 shown in FIG. 12 is a downward direction, to change the magnetization direction to an upward direction, a current is applied from the magnetization reference layer 12 toward the magnetization reference layer 26. Here, up-spins are injected from the magnetization reference layer 22 into the magnetic materials 20 in the spin filter layer 18.

Figure 14:
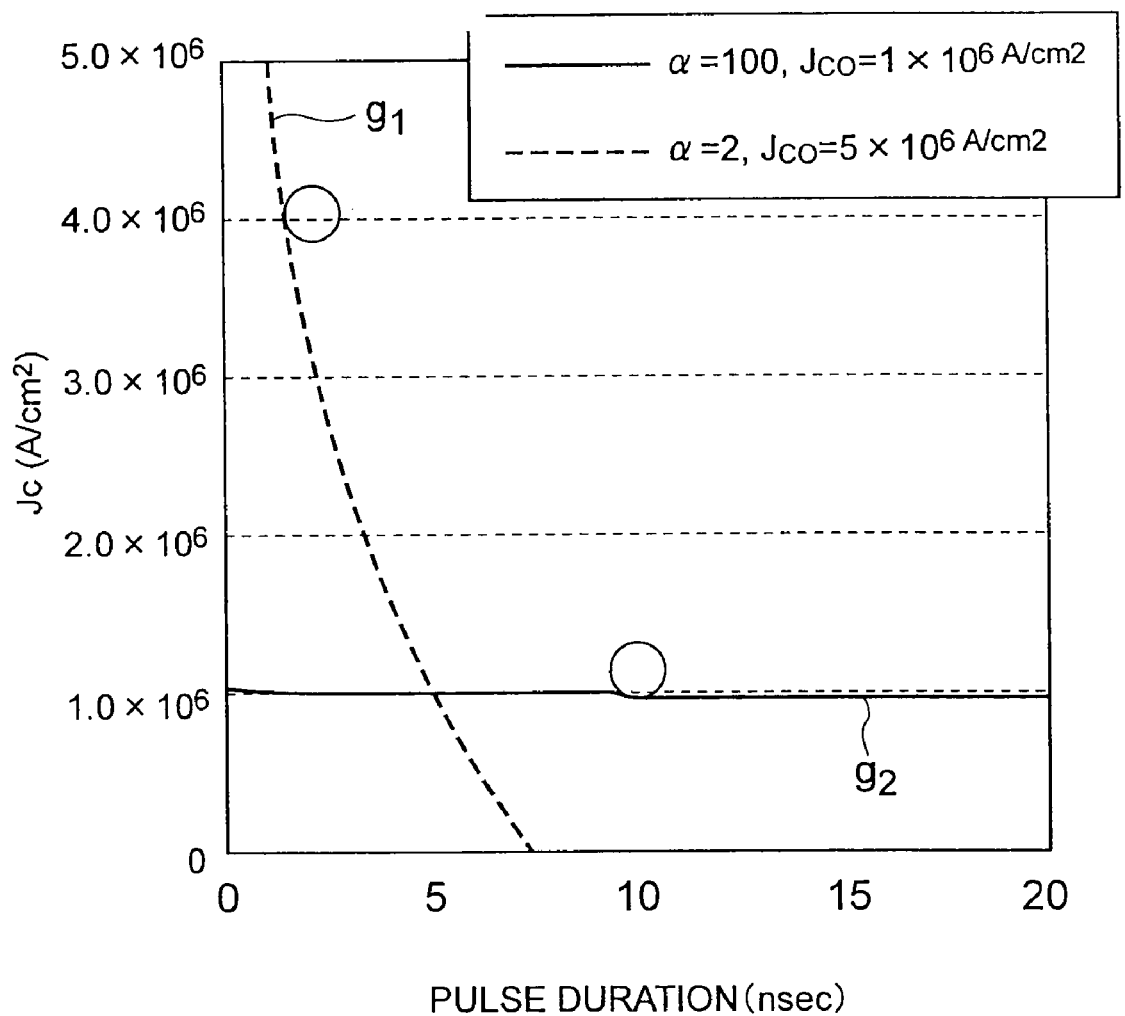
FIG. 14 shows the relationship between the current pulse duration and the current density in the second embodiment.

Graph $g_1$ in FIG. 14 shows the relationship between the current pulse duration and the current density $J_C$ for aligning the magnetization directions of the magnetic materials 20 in the spin filter layer 18 with a certain direction. Graph $g_2$ in FIG. 14 shows the relationship between the current pulse duration and the write current density $J_C$ of the magnetic memory layer 16. The graph $g_1$ shows a case where α of the magnetic materials 20 of the spin filter layer 18 is 2, and the current density $J_{C0}$ with which the magnetization is reversed when the pulse duration becomes equivalent to the initial reversal-related switching time $\tau_0$ is $5.0 \times 10^6$ A/cm². The graph $g_2$ shows a case where α of the magnetic memory layer 16 is 100, and the current density $J_{C0}$ with which the magnetization is reversed when the pulse duration becomes equivalent to the initial reversal-related switching time $\tau_0$ is $1.0 \times 10^6$ A/cm$^2$.

Where the density of the current flowing from the magnetization reference layer 12 toward the magnetization reference layer 26 is approximately $1 \times 10^6$ A/cm$^2$, when the current pulse duration becomes 5 nsec or more, the spin directions of the magnetic materials 20 of the spin filter layer 18 become upward directions due to the spin torque imparted by the magnetization reference layer 22. Further, an upward spin torque is imparted to the magnetic memory layer 16 by the magnetic materials 20 of the spin filter layer 18, and the spin direction of the magnetic memory layer 16 is reversed from the downward direction to the upward direction.

In a case where the spin direction of the magnetic memory layer 16 is the downward direction, to change the magnetization direction to the upward direction, a current is applied from the magnetization reference layer 26 toward the magnetization reference layer 12. If the density of the current flowing from the magnetization reference layer 26 toward the magnetization reference layer 12 is approximately $1 \times 10^6$ A/cm$^2$, down-spins are injected from the magnetization reference layer 12 toward the magnetic memory layer 16, and the magnetization direction in the magnetic memory layer 16 becomes the downward direction.

A read is performed by applying a current from the magnetization reference layer 12 toward the magnetization reference layer 26. For example, where the read time is 2 nsec to 3 nsec and the current density of the read current is approximately $1 \times 10^6$ A/cm$^2$ when the magnetization direction of the magnetic memory layer 16 is the downward direction, the spin directions of the magnetic materials 20 of the spin filter layer 18 remain varied. Therefore, the spin torque imparted to the magnetic memory layer 16 during a read operation is reduced, and an inadvertent write during a read operation can be prevented.

As described above, in this embodiment, the spin directions among the magnetic materials 20 (or in the magnetic layers 20a) of the spin filter layer 18 need to remain random during a read operation. Therefore, the magnetization in the magnetic materials 20 (or the magnetic layer 20a) of the spin filter layer 18 should be substantially zero, where there is not an external magnetic field.

Also, in this embodiment, $\alpha_{therm}$ of the magnetic materials 20 (or the magnetic layer 20a) of the spin filter layer 18 should preferably be smaller than $\alpha_{therm}$ of the magnetic memory layer 16. Because of this, the magnetic materials 20 of the spin filter layer 18 are more easily affected by a thermal disturbance than the magnetic memory layer 16 by a thermal disturbance. Here, $\alpha_{therm1}$ of the magnetic materials 20 of the spin filter layer 18 should preferably be smaller than 25, and $\alpha_{therm2}$ of the magnetic memory layer 16 should preferably be larger than 60.

Also in this embodiment, the pulse duration of the read current pulse should preferably be shorter than the initial reversal-related switching time $\tau_0$, and the pulse duration of the write current pulse should preferably be equal to or longer than the initial reversal-related switching time $\pi_0$.

The magnetic memory layer 16 and the magnetization reference layers 12, 22, and 26 of the magnetic memory element 10 of this embodiment should preferably be made of magnetic materials with perpendicular magnetic anisotropy. The magnetic materials of the magnetic memory layer 16 and the magnetization reference layers 12, 22, and 26 that achieve perpendicular magnetization preferably have a magnetic anisotropy energy density as high as $5 \times 10^5$ erg/cc or more. Specific examples of such magnetic materials are described in the following.

(1) Disordered Alloys

The magnetic materials of the magnetic memory layer 16 and the magnetization reference layers 12, 22, and 26 may be the alloys containing at least one element of Cr, Ta, Nb, V, W, Hf, Ti, Zr, Pt, Pd, Fe, and Ni, with Co being a base. For example, a CoCr alloy, a CoPt alloy, a CoCrTa alloy, a CoCrPt alloy, a CoCrPtTa alloy, a CoCrNb alloy, or the like may be employed. In each of those alloys, the magnetic anisotropy energy density and the saturation magnetization can be adjusted by increasing the proportion of the nonmagnetic element.

(2) Ordered Alloys

The magnetic materials of the magnetic memory layer 16 and the magnetization reference layers 12, 22, and 26 may be alloys containing at least one element of Fe, Co, and Ni, and at least one element of Pt and Pd, and may be ordered alloys having L10 crystalline structures. Examples of those alloys include $Fe_{50}Pt_{50}$, $Fe_{50}Pd_{50}$, $CO_{50}Pt_{50}$, $Fe_{30}Ni_{20}Pt_{50}$, $CO_{30}Fe_{20}Pt_{50}$, and $CO_{30}Ni_{20}Pt_{50}$. The magnetic anisotropy energy density and the saturation magnetization can be adjusted to low levels by adding an impurity element such as Cu (copper), Cr, or Ag (silver), or an alloy of those materials, or an insulating material to any of the above ordered alloys.

(3) Artificial Lattice Layers

The magnetic memory layer 16 and the magnetization reference layers 12, 22, and 26 may be stacked layers in which at least one element of Fe, Co, and Ni or a magnetic film containing the one element, and a nonmagnetic element of Pt, Pd, Ir, Rh, Ru, Os, or Re, or a nonmagnetic film containing the nonmagnetic element are stacked alternately. Specific examples include a Co/Pt artificial lattice layer, a Co/Pd artificial lattice layer, a CoCr/Pt artificial lattice layer, a Co/Ru artificial lattice layer, and a Co/Os artificial lattice layer. In each of those artificial lattice layers, the magnetic anisotropy energy density and the saturation magnetization can be controlled by adding an element to the magnetic layer and adjusting the film thickness ratio of the magnetic layers to the nonmagnetic layers.

(4) Ferrimagnetic Materials

The magnetic materials of the magnetic memory layer 16 and the magnetization reference layers 12, 22, and 26 may be ferrimagnetic materials formed with alloys of rare-earth metals and transition metals. For example, amorphous alloys that contain at least one element of Tb (terbium), Dy (dysprosium), Gd (gadolinium), and a transition metal can be employed. Specific examples of those amorphous alloys include TbFe, TbCo, TbFeCo, DyTbFeCo, and GdTbCo. In each of those alloys, the magnetic anisotropy energy density and the saturation magnetization can be controlled by adjusting the composition.

Each of the magnetic layers may have a structure in which the magnetic portion and the nonmagnetic portion are separated from each other, with the nonmagnetic portion being segregated. For example, such a nonmagnetic portion may be formed with an oxide, a nitride, or a carbide, such as $SiO_2$, MgO, SiN, or SiC. Alternatively, an alloy such as a nonmagnetic CoCr alloy with a high Cr concentration of 25 at % or more may be employed.

A magnetic metal layer that is formed with at least one element of Fe, Co, and Ni or an alloy containing one of those alloys may be placed as a high-polarizability material at the interface between the tunnel barrier layer 14 and a magnetic layer (the magnetic memory layer 16 or the magnetization reference layer 12) in contact with the tunnel barrier layer 14, so as to increase the magneto-resistive (MR) ratio. Normally, each of those magnetic layers has in-plane magnetization as a single layer. Therefore, it is necessary to adjust the magnetic film thickness ratio with respect to the stacked perpendicular magnetic anisotropy material, so as not to degrade the stability of perpendicular magnetization.

In this embodiment, the magnetization directions of the magnetization reference layers 12, 22, and 26 and the magnetic memory layer 16 are perpendicular to the film plane. However, the magnetization directions may run parallel to the film plane. In such a case, the following structure is preferred.

Either the stacked film formed with the magnetization reference layer 22, the nonmagnetic layer 24, and the magnetization reference layer 26, or the magnetization reference layer 12 is preferably a stacked film formed with an antiferromagnetic layer, a first ferromagnetic layer, a nonmagnetic layer, and a second ferromagnetic layer. The other layer is preferably a third ferromagnetic layer as a single layer of higher coercivity than the magnetic memory layer 16. Those layers are made of the following materials.

The antiferromagnetic layer is made of a material such as PtMn, IrMn, or FeMn.

The first to third ferromagnetic layers and the magnetic memory layer 16 may be made of a magnetic metal that contains at least one element of Fe, Co, and Ni, or an alloy containing the one element. Alternatively, magnetite with high spin polarizability, or an oxide such as $CrO_2$ or $RXMnO_{3-Y}$ (R being a rare-earth metal, X being Ca, Ba, or Sr), or a Heusler alloy such as NiMnSb or PtMnSb. Those metals may contain a small amount of a nonmagnetic element such as Ag, Cu, Au, Al, Mg, Si, Bi, Ta, B, C, O, N, Pd, Pt, Zr, Ir, W, Mo, or Nb, as long as the ferromagnetism is not lost.

The above nonmagnetic layer and the nonmagnetic layer 24 shown in FIG. 12 are preferably made of a precious metal such as Ru, Cu, or Au.

Whether the magnetization directions run perpendicular or parallel to the film plane, the magnetic memory layer 16 may be a stack film formed with a ferromagnetic layer, a nonmagnetic layer, and a ferromagnetic layer. In such a case, the magnetization reference layer 22, the nonmagnetic layer 24, and the magnetization reference layer 26 preferably form a stacked film, and the magnetization reference layer 12 preferably has a stacked structure formed with an antiferromagnetic layer, a ferromagnetic layer, a nonmagnetic layer, and a ferromagnetic layer. However, the stacked film formed with the magnetization reference layer 22, the nonmagnetic layer 24, and the magnetization reference layer 26, and the magnetization reference layer 12 may be single-layer ferromagnetic layers of higher coercivity than the magnetic memory layer 16.

The magnetic materials 20 of the spin filter layer 18 shown in FIG. 12 are the materials mentioned above as the materials of the magnetic memory layer 16 and the magnetization reference layers 12, 22, and 26. The crystal magnetic anisotropy energy density of the magnetic materials 20 is adjusted by controlling the composition ratio of the materials. Also, the nonmagnetic layer 19 of the spin filter layer 18 is preferably made of a precious metal material such as Ru, Cu, or Au.

The magnetic layer 20a of the spin filter layer 18 shown in FIG. 13 is made of the materials mentioned above as the materials of the magnetic memory layer 16 and the magnetization reference layers 12, 22, and 26, and the crystal magnetic anisotropy energy density is adjusted by controlling the composition ratio of the materials. Also, the nonmagnetic layers 19a and 19b of the spin filter layer 18 shown in FIG. 13 are preferably made of a precious metal material such as Ru, Cu, or Au.

Various dielectric materials such as $AlO_x$ ($Al_2O_3$, for example), $MgO_x$, $SiO_2$, AlN, $Bi_2O_3$, $MgF_2$, $CaF_2$, $SrTiO_2$, and $AlLaO_3$ may be used as the material of the tunnel barrier layer 14. Those dielectric materials may contain oxygen, nitrogen, or a fluorine deficiency. Alternatively, the layer 14 may not be a tunnel barrier, but may be a magneto-resistive layer such as a conductive metal, a half metal, or a semiconductor that realizes a magneto-resistive effect.

The materials of the magnetic memory layer 2 and the magnetization reference layer 6 of the TMR element 1 of the first embodiment shown in FIG. 1 may be the same materials of the magnetic memory layer 16 and the magnetization reference layers 12, 22, and 26 of the second embodiment. Also, the tunnel barrier layer 4 of the TMR element 1 shown in FIG. 1 may be made of the same material as the material of the tunnel barrier layer 14 of the second embodiment.

The magnetic memory of the second embodiment shown in FIG. 11 can be turned into a magnetic memory that can utilize the driving method of the first embodiment by replacing the magnetic memory element 10 with the TMR element 1 of the first embodiment.

Alternatively, the driving method of the first embodiment may be utilized in the magnetic memory of the second embodiment to perform read and write operations.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method for driving a magnetic memory that includes a memory cell having a magnetic memory element that includes a magnetization reference layer in which a magnetization direction is fixed, a magnetic memory layer in which a magnetization direction is changeable, and a tunnel barrier layer interposed between the magnetization reference layer and the magnetic memory layer, the magnetization direction of the magnetic memory layer being changeable by applying a write current pulse to inject spin-polarized electrons into the magnetic memory layer, the method comprising:

applying the write current pulse for writing information in the magnetic memory layer; and applying a read current pulse for reading the information from the magnetic memory layer, wherein duration of the write current pulse is longer than that of the read current pulse, and the magnetic anisotropy field Hk of the magnetic memory layer is in the range of 50 Oe to 5000 Oe, and wherein the read current pulse is applied a plurality of times to obtain one datum of the information from the magnetic memory through an integrated read current value, and each pulse duration of the read current pulse applied the plurality of times is shorter than the pulse duration of the write current.

2. A method for driving a magnetic memory that includes a memory cell having a magnetic memory element that includes a magnetization reference layer in which a magnetization direction is fixed, a magnetic memory layer in which a magnetization direction is changeable, and a tunnel barrier layer interposed between the magnetization reference layer and the magnetic memory layer, the magnetization direction of the magnetic memory layer being changeable by applying a write current pulse to inject spin-polarized electrons into the magnetic memory layer, the method comprising:

applying the write current pulse for writing information in the magnetic memory layer; and applying a read current pulse for reading the information from the magnetic memory layer, wherein duration of the write current pulse is longer than that of the read current pulse, and the magnetic anisotropy field Hk of the magnetic memory layer is in the range of 50 Oe to 5000 Oe, and wherein the pulse duration of the read current pulse is shorter than an initial reversal-related switching time $\tau_0$, and the pulse duration of the write current pulse is equal to or longer than the initial reversal-related switching time $\tau_0$.

3. A magnetic memory comprising:

a memory cell having a magnetic memory element that includes a magnetization reference layer in which a magnetization direction is fixed, a magnetic memory layer in which a magnetization direction is changeable, and a nonmagnetic layer interposed between the magnetization reference layer and the magnetic memory layer, the magnetization direction of the magnetic memory layer being changeable by applying a write current pulse to inject spin-polarized electrons into the magnetic memory layer;

a read circuit that generates a read current pulse for reading information from the magnetic memory element;

a write circuit that generates a write current pulse for writing information in the magnetic memory element, the write current pulse having a longer pulse duration than a pulse duration of the read current pulse;

a first line that is connected to one terminal of the magnetic memory element, the write current pulse running through the first line when a write is performed, the read current pulse running through the first line when a read is performed; and a second line that is connected to another terminal of the magnetic memory element, the write current pulse running through the second line when the write is performed, the read current pulse running through the second line when a read is performed, wherein the magnetic anisotropy field Hk of the magnetic memory layer is in the range of 50 Oe to 5000 Oe, and wherein the read current pulse is applied a plurality of times to obtain one datum of the information from the magnetic memory through an integrated read current value, and each pulse duration of the read current pulse applied the plurality of times is shorter than pulse duration of the write current.

* * * * *